United States Patent
An et al.

(10) Patent No.: US 7,952,433 B2
(45) Date of Patent: May 31, 2011

(54) POWER AMPLIFIERS WITH DISCRETE POWER CONTROL

(75) Inventors: Kyu Hwan An, Dunwoody, GA (US); Dong Ho Lee, Cedar Rapids, IA (US); Chang-Ho Lee, Marietta, GA (US); Joy Laskar, Marietta, GA (US)

(73) Assignees: Samsung Electro-Mechanics Company (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/620,476

(22) Filed: Nov. 17, 2009

(65) Prior Publication Data

US 2010/0127780 A1   May 27, 2010

Related U.S. Application Data

(60) Provisional application No. 61/117,780, filed on Nov. 25, 2008.

(51) Int. Cl.
 *H03F 3/68* (2006.01)
(52) U.S. Cl. ............. 330/295; 330/51; 330/302
(58) Field of Classification Search ........ 330/51, 330/124 R, 295, 302
See application file for complete search history.

(56) References Cited

U.S. PATENT DOCUMENTS

| 5,256,987 | A | 10/1993 | Kibayashi et al. |
| 5,872,481 | A | 2/1999 | Sevic et al. |
| 7,336,127 | B2 * | 2/2008 | Kennan ............ 330/124 R |
| 7,746,174 | B2 * | 6/2010 | Yang et al. ............ 330/295 |

FOREIGN PATENT DOCUMENTS

| KR | 20040085217 A | 10/2004 |
| KR | 20050058266 A | 6/2005 |
| WO | 03049145 A2 | 6/2003 |
| WO | 03073603 A2 | 9/2003 |

OTHER PUBLICATIONS

A. Shirvani, D. K. Su, and B. A.Wooley, "ACMOSRF power amplifier with parallel amplification for efficient power control," IEEE J. Solid-State Circuits, vol. 37, No. 6, pp. 684-693, Jun. 2002.

P. Reynaert and M. Steyaert, "A 2.45-GHz 0.13-μm CMOS PA with parallel amplification," IEEE J. Solid-State Circuits, vol. 42, No. 3, pp. 551-562, Mar. 2007.

(Continued)

*Primary Examiner* — Khanh V Nguyen
(74) *Attorney, Agent, or Firm* — Sutherland Asbill & Brennan LLP (57) ABSTRACT

Systems and methods are provided for power amplifiers with discrete power control. The systems and methods may include a plurality of unit power amplifiers; a plurality of primary windings, wherein each primary winding is connected to at least one respective output port of a respective one the plurality of unit power amplifiers; a secondary winding inductively coupled to the plurality of primary windings, where the secondary winding provides an overall output; a bias controller, where the bias controller provides a respective bias voltage based at least in part on a level of output power to one or more of the plurality of unit power amplifiers; and a switch controller, where the switch controller operates to activate or deactivate at least one of the plurality of unit power amplifiers via a respective control signal.

20 Claims, 7 Drawing Sheets

OTHER PUBLICATIONS

I. Aoki, S. D. Kee, D. B. Rutledge, and A. Hajimiri, "Fully integrated CMOS power amplifier design using the distributed active-transformer architecture," IEEE J. Solid-State Circuits, vol. 37, No. 3, pp. 371-383, Mar. 2002.

J. Kang, A. Hajimiri, and B. Kim, "A single-chip linear CMOS power amplifier for 2.4 GHz WLAN," IEEE ISSCC Tech. Dig., pp. 761-762, Feb. 2006.

H. S. Bennett, R. Brederlow, J. C. Costa, P. E. Cottrell, W. M. Huang, A. A. Immorlica Jr., J. E. Muller, M. Racanelli, H. Shichijo, C. E. Weitzel, and B. Zhao, "Device and technology evolution for Si-based RF integrated circuits," IEEE Trans. Electron Devices, vol. 52, No. 7, pp. 1235-1258, Jul. 2005.

G. Liu, P. Haldi, T.-J. K. Liu, and A. M. Niknejad, "Fully integrated CMOS power amplifier with efficiency enhancement at power backoff," IEEE J. Solid-State Circuits, vol. 43, No. 3, pp. 600-609, Mar. 2008.

K. H. An, O. Lee, H. Kim, D. H. Lee, J. Han, K. S. Yang, Y. Kim, J. J. Chang, W.Woo, C.-H. Lee, H. Kim, and J. Laskar, "Power-combining transformer techniques for fully-integrated CMOS power amplifiers," IEEE J. Solid-State Circuits, vol. 43, No. 5, pp. 1064-1075, May 2008.

Office Action for Korean Application No. 10-2009-0114760 mailed Feb. 24, 2011.

* cited by examiner

POWER AMPLIFIERS WITH DISCRETE POWER CONTROL

RELATED APPLICATION

This application claims priority to U.S. Provisional Application No. 61/117,780, filed on Nov. 25, 2008, and entitled "POWER AMPLIFIERS WITH DISCRETE POWER CONTROL USING BIAS ADAPTATION AND PARALLEL-COMBINED MULTI-PRIMARY TRANSFORMERS", which is hereby incorporated by reference in its entirety as if fully set forth herein.

FIELD OF INVENTION

Embodiments of the invention relate generally to power amplifiers, and more particularly, to power amplifiers with discrete power control using bias adaptation and parallel-combined multi-primary transformers.

BACKGROUND OF THE INVENTION

With the increase in use and reliance on wireless communications have come strong demands for driving down the cost of providing radio transceivers. From an implementation perspective, single-chip radios with complementary metal oxide semiconductors (CMOS) components, including front-end components such as radio frequency power amplifiers, are a more cost-effective solution than conventional components including conventional power amplifiers. However, due to the properties of CMOS devices, the expected efficiencies of CMOS power amplifiers are generally lower than those of conventional power amplifiers such as the III-V HBT power amplifiers. Still, the increasing operation of wireless communication devices at high data-rate modulations with large peak-to-average power ratio causes power amplifiers in those devices to operate at power back-off below the 1-dB compression point. Moreover, with a fixed bias control, the efficiency of conventional power amplifiers operating at power back-off levels gets lower and output power decreases.

BRIEF SUMMARY OF THE INVENTION

According to an example embodiment of the invention, there may be a power amplifier system. The power amplifier system may include a plurality of unit power amplifiers, where each unit power amplifier includes at least one output port, at least one bias control port, and at least one switch control port. The bias control port and the switch control port may be controlled by the level of output power to enhance the efficiency at power back-off by reducing DC supplying current to each unit power amplifier. The power amplifier system may also include a plurality of primary windings in parallel, where each primary winding is connected to at least one output port of the plurality of unit power amplifiers, and a single secondary winding inductively coupled to the plurality of primary windings.

According to an example embodiment of the invention, there is a power amplifier system. The system may include a plurality of unit power amplifiers, wherein each unit power amplifier includes at least one respective output port, at least one respective bias control port, and at least one respective switch control port; a plurality of primary windings, where each primary winding is connected to the at least one respective output port of a respective one the plurality of unit power amplifiers; and a secondary winding inductively coupled to the plurality of primary windings, where the secondary winding provides an overall output; and a bias controller, where the bias controller provides a respective bias voltage based at least in part on a level of output power to one or more of the plurality of unit power amplifiers via the at least one respective bias control port; and a switch controller, where the switch controller operates to activate or deactivate at least one of the plurality of unit power amplifiers via a respective control signal to the respective switch control port.

According to another example embodiment of the invention, there is another power amplifier system. The system may include a plurality of unit power amplifiers, where each unit power amplifier includes a respective input port, a respective output port, a respective bias control port, and a respective switch control port; a transformer comprising a plurality of primary windings that is inductively coupled to a single secondary winding, wherein each primary winding is connected to a respective output port of the respective plurality of unit power amplifiers; and one or more controllers for biasing and activating ones of the plurality of unit power amplifiers, where respective outputs from one or more activated ones of the plurality of unit power amplifiers are provided to the respective primary windings, which induce voltage on the secondary winding to provide an overall output.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may be directed to power amplifiers with discrete power control and methods for providing and using such power amplifiers. In an example embodiment of the invention, output power control for power amplifiers may be provided using bias adaptation and multi-primary transformers combined in parallel to couple one or more power amplifiers to a load. The power amplifier devices and their methods of use described herein may enhance the efficiency of providing output power from power amplifiers operating at power back-off levels, thereby reducing waste of supplied DC power and lengthening the battery life for devices such as mobile devices (e.g., a mobile phone, radio, pager, laptop computer, handheld computer, personal digital assistant device, and the like).

Figure 1:
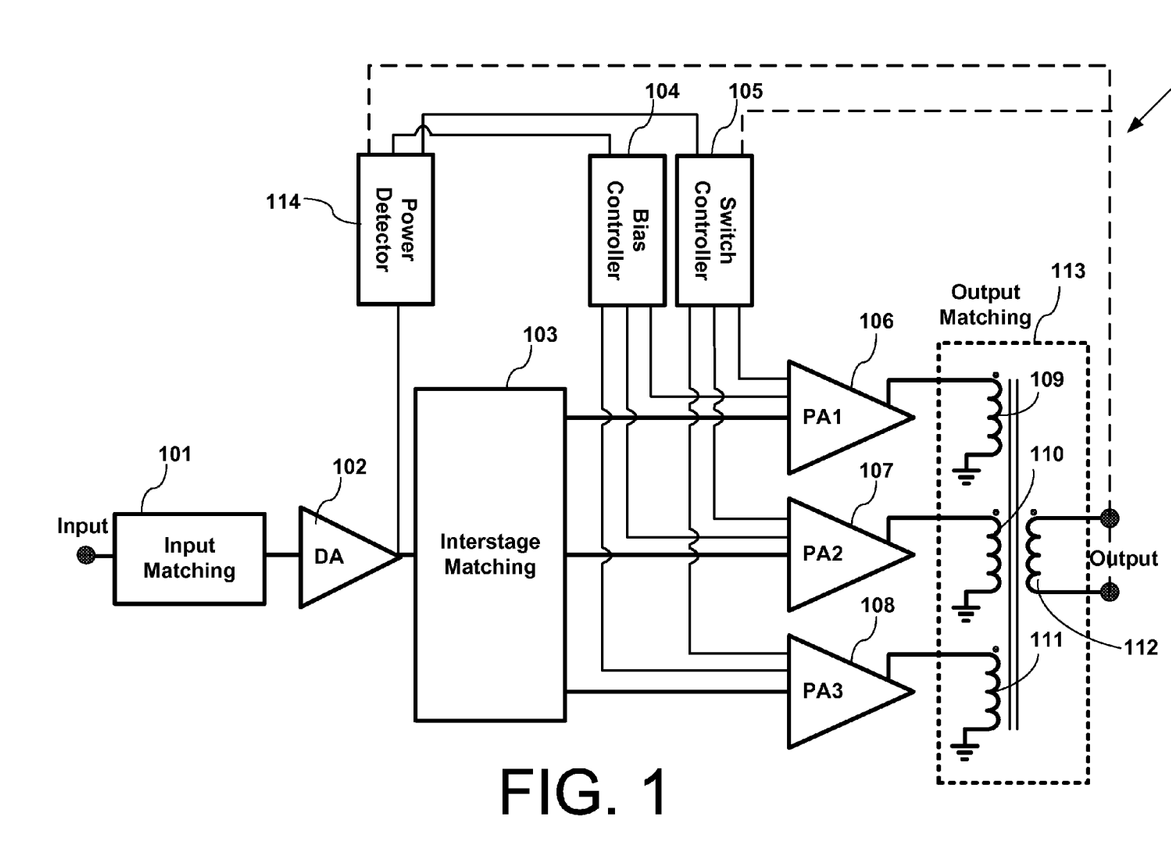
FIG. 1 illustrates an example block diagram of a power amplifier system, according to an example embodiment of the invention.

FIG. 1 illustrates an example block diagram of a power amplifier system 100 in accordance with an example embodiment of the invention. As shown in FIG. 1, the power amplifier system 100 may include an input matching component 101, a driver amplifier 102, an interstage matching component 103, a bias controller 104, a switch controller 105, unit power amplifiers 106, 107, and 108, and an output matching component 113. In the output matching component 113, primary windings 109, 110, and 111 may be inductively coupled to a single secondary winding 112, according to an example embodiment of the invention. It will be appreciated that additional or alternative components may likewise be available in FIG. 1 without departing from example embodiments of the invention.

With continued reference to FIG. 1, a bias control port and/or a switch control port of the unit power amplifiers 106, 107, and 108 may be controlled by the bias controller 104 and switch controller 105, respectively, based at least in part on the level of output power of the power amplifier system 100, which may enhance the efficiency at power back-off levels by reducing DC supplying current to each unit power amplifier 106, 107, 108. The bias controller 104 and switch controller 105 may receive information regarding the detected output power of amplifier 102 (or alternatively, secondary winding 112) via a power detector 114. According to an example embodiment of the invention, the power detector 114 may comprise a line coupler for magnetic coupling, or a capacitor for electrically coupling, to the output of the amplifier 102, or alternatively, the output of the secondary winding 112. It will be appreciated that the power detector 114 and/or the bias controller 104 may be implemented as similarly described in U.S. patent application Ser. No. 12/620,462, filed on Nov. 17, 2009, and entitled "Systems and Methods for an Adaptive Bias Circuit for a Differential Power Amplifier", which is hereby incorporated by reference.

In the example embodiment of the invention shown in FIG. 1, by selectively activating and deactivating unit power amplifiers 106, 107, and 108, three different modes of operation can be acquired. These three different modes may be referred to herein as (i) PA1 ("low power operational mode"), (ii) PA1+PA2 ("intermediate power operational mode"), and (iii) PA1+PA2+PA3 ("high power operational mode"), according to an example embodiment of the invention. Each mode may be associated with a respective output power range, according to an example embodiment of the invention. For example, there may be a high output power range associated with the high power operational mode, an intermediate output power range associated with the intermediate power operational mode, and a low output power range associated with the lower power operational mode.

In high power operation (for the high output power range), the mode of PA1+PA2+PA3 may be invoked where the switch controller 105 activates all three unit power amplifiers 106, 107, and 108 via the respective switch control port to generate a maximum available output power. Likewise, the bias controller 104 may also provide the appropriate bias voltage, as will be discussed with respect to FIGS. 4A and 4B, to unit power amplifiers 106, 107, and 108 via the respective bias control port. In particular, the outputs of power amplifiers 106, 107, and 108 may be provided to respective primary windings 109, 110, 112, which are inductively coupled to the single secondary winding 112 that combines the voltages/currents induced by three primary windings 109, 110, 112 to provide the maximum available output power.

As the requirement of output power decreases into a power back-off range (e.g., an intermediate output power range), an intermediate power operation may be desirable and the mode may be switched to the mode of PA1+PA2, where the switch controller 105 deactivates unit power amplifier 108 and maintains the activation of two unit power amplifiers 106 and 107 via the respective bias control port. Likewise, the bias controller 104 may also provide the appropriate bias voltage to unit power amplifiers 106 and 107 via the respective bias control port (with perhaps no or minimal bias voltage to unit power amplifier 108). In this case, the outputs of power amplifiers 106 and 107 may be provided to respective primary windings 109, 110, which are inductively coupled to the single secondary winding 112 that combines the voltages/currents induced by two primary windings 109, 110 to provide an intermediate output power.

As the requirement of output power further decreases into another power back-off range (e.g., an intermediate output power range), a low power operation may be desirable and the mode PA1 may be invoked where only one unit power amplifier 106 remains activated and unit power amplifiers 107 and 108 are deactivated via the switch control port. Likewise, the bias controller 104 may also provide the appropriate bias voltage to unit power amplifier 106 via the respective bias control port (with perhaps no or minimal bias voltage to unit powers amplifiers 107, 108). In this case, the output power of power amplifier 106 may be provided to primary winding 109, which is inductively coupled to the single secondary winding that provides a low output power.

In another example embodiment of the invention, as power operations increase from low, to intermediate, to high, the modes of PA1, PA1+PA2, and PA1+PA2+PA3 may be invoked accordingly. It will be appreciated that many variations of FIG. 1 are available without departing from example embodiments of the invention. According to an example variation, there may be more than three unit power amplifiers and corresponding primary windings. Thus, there may likewise be more than three power modes available in accordance with example embodiments of the invention.

Figure 2:
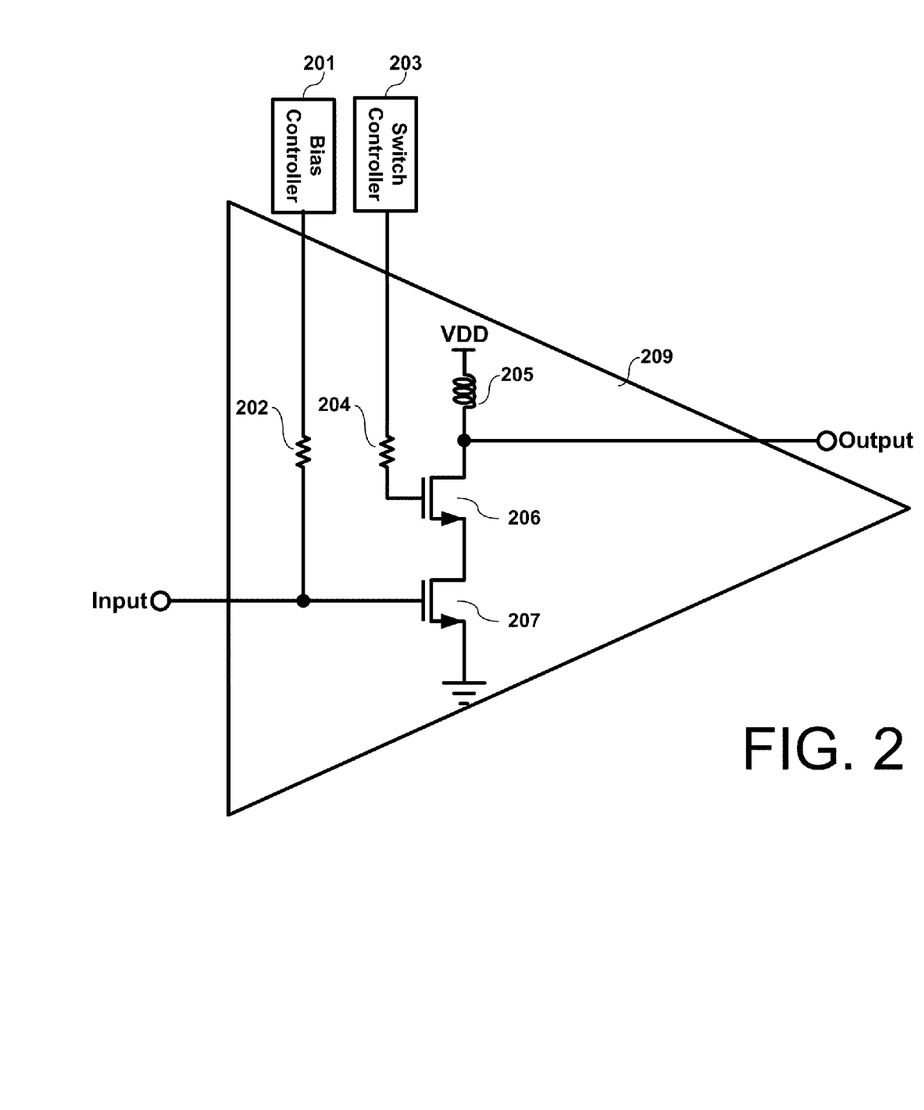
FIG. 2 illustrates an example circuit diagram of a unit power amplifier, according to an example embodiment of the invention.

FIG. 2 illustrates a circuit diagram of an example unit power amplifier 209 in accordance with an example embodiment of the invention. The example unit power amplifier 209 may be an example implementation for the unit power amplifiers 106, 107, 108, although other implementations may be utilized as well. As shown in FIG. 2, the unit power amplifier 209 may include bias resistors 202 and 204, a bias choke 205, a switch stage 206, and a gain stage 207. The switch stage 206 may be controlled by the output of the switch controller 203, and the gain stage 207 may be controlled by the output of the bias controller 201.

The switch stage 206 and the gain stage 207 may comprise respective transistors, including field effect transistors (FETs) such as N-channel metal-oxide-semiconductor FETs (MOSFETs). Each transistor may have a respective gate, source, and drain. As shown in FIG. 2, the gate of the gain stage 207 transistor may be connected to the unit power amplifier 209 input, which may be an output of a driver amplifier/interstage matching component. The gate of the gain stage 207 transistor may also be connected to bias controller 201 via an intervening bias resistor 202. The source of the gain stage 207 transistor may be connected to ground while the drain of the gain stage 207 transistor may be connected to the source of the switch stage 206 transistor. The gate of the switch stage 206 transistor may be connected to switch controller 203 via an intervening bias resistor 204. The drain of the switch stage 206 transistor may provide the output of the unit power amplifier 209. The drain of the switch stage 206 transistor may likewise be connected to a first end of bias choke 205, and a second end of the bias choke may be connected to a DC voltage supply VDD. It will be appreciated that in example embodiments of the invention, bipolar junction transistors (BJTs) having respective bases, emitters, and collectors can also be utilized instead of the FETs described herein. Indeed if BJTs are utilized instead of FETs, then the description of the gates, sources, and drains described herein may be substituted with corresponding bases, emitters, and collectors without departing from example embodiments of the invention.

The switch controller 203 may activate or deactivate the unit power amplifier 209 by providing an appropriate bias control signal (e.g., a switch voltage) to the switch stage 206 transistor. For example, the switch controller 203 may deactivate the unit power amplifier 209 by minimizing or eliminating the bias voltage to the switch stage 206 transistor. On the other hand, the switch controller 203 may activate the unit power amplifier 209 by providing the appropriate bias voltage to the switch stage 206 transistor. If the switch controller 203 activates the switch stage 206, then the gain stage 207 output may be provided to the output of the unit power amplifier 209. On the other hand, if the switch controller 203 deactivates the switch stage 206, then there may be an open circuit between the gain stage 207 output and the output of the unit power amplifier 209, thereby reducing the DC current supplied by VDD. The bias controller 201 may provide a bias signal (e.g., a bias voltage) to the gain stage 207 transistor. The bias signal may enable the gain stage 207 to amplify a received input signal to generate an amplified signal, according to an example embodiment of the invention. Indeed, the bias signal may control operational efficiency and/or gain of the unit power amplifier 209, according to an example embodiment of the invention.

Figure 3:
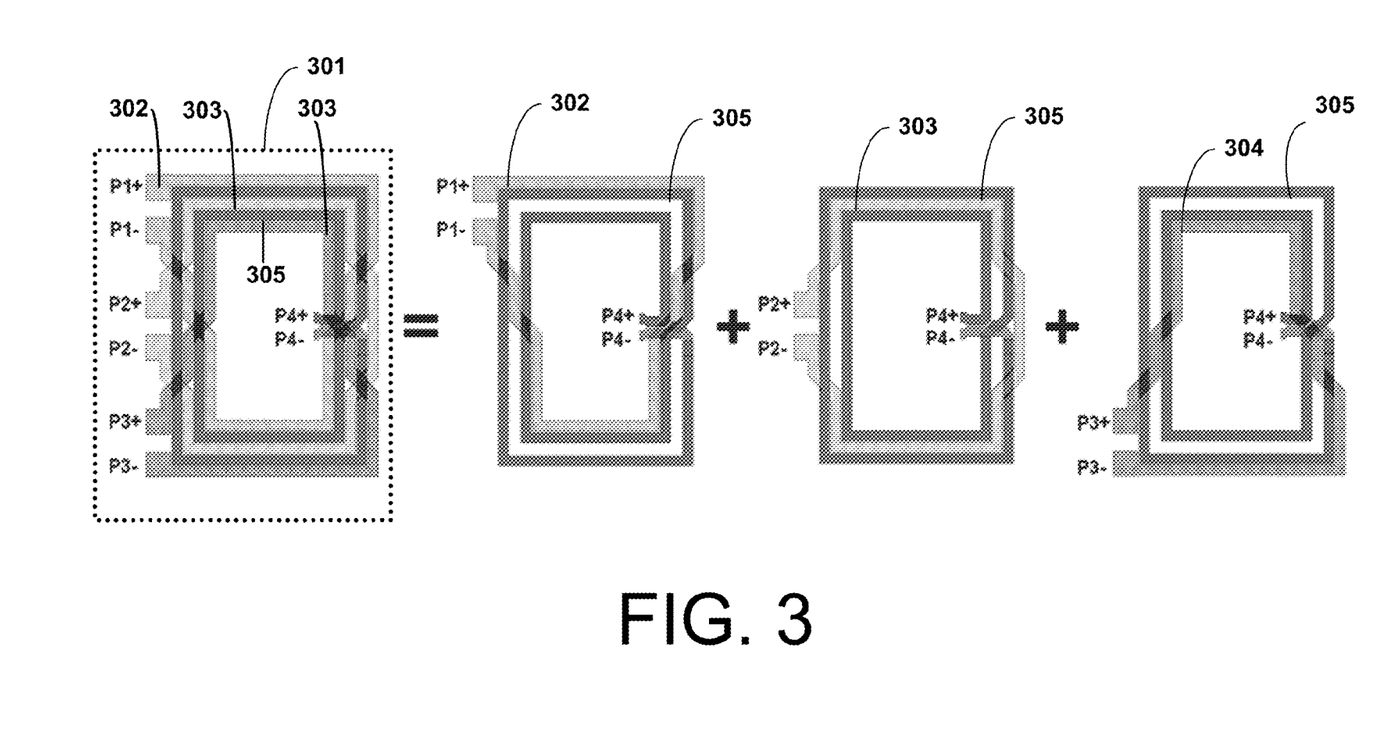
FIG. 3 illustrates an example layout structure of a transformer using three primary windings and a single secondary winding with the turn ratio from one primary winding to the second winding being 1:2, according to an example embodiment of the invention.

FIG. 3 illustrates an example layout structure of a transformer 301 using three primary windings and a single secondary winding with the turn ratio n=N1:N2 from one primary winding to the single secondary winding being 1:2 in accordance with an example embodiment of the invention. Each of the three primary windings may including single turn, while the single secondary winding may include more than one turn, in whole or in part (e.g., 1.5 turns, 2 turns, etc.), according to an example embodiment of the invention By using a single secondary winding with more than one turn or multiple turns, the secondary winding may be interleaved between the primary windings as illustrated in FIG. 3. In an example embodiment of the invention, increasing the turn ratio of the secondary winding 305 may boost the voltage of the primary windings at the secondary winding 305 by a factor of N2N1. The primary and secondary pairs are magnetically coupled and physically detached from each other to isolate the deactivated unit power amplifiers while providing impedance matching and power combining, according to an example embodiment of the invention.

In an example embodiment of the invention, the output matching component 113 in FIG. 1 may implemented using the example transformer 301 in FIG. 3. Similarly, the primary windings 109, 110, and 111 in FIG. 1 may be implemented as the primary windings 302, 303, and 304 in FIG. 3, and the secondary winding 112 in FIG. 1 may correspond to the secondary winding 305 in FIG. 3. In FIG. 3, the single secondary winding 305 may include two turns, including at least an inner first turn and an outer second turn that are substantially concentric with each other. The first primary winding 302, which may include a single turn, may have a portion positioned along an outer edge of the outer second turn of the secondary winding 305, an interleaved portion, and another portion positioned along an inner edge of the inner first turn of secondary winding 305. The second primary winding 303, which may likewise include a single turn, may be substantially positioned between the inner first turn and the outer second turn, along with an interleaved portion. The third primary winding 304, which may also include a single turn, may have a portion positioned along an inner edge of the inner first turn of the secondary winding 305, an interleaved portion, and another portion positioned along an outer edge of the outer second turn of the secondary winding 305. It will be appreciated that many variations in the relative positioning of primary windings 302, 303, 304 to the secondary winding 305 are available without departing from example embodiments of the invention.

Ss also shown in FIG. 3, the input ports (P1+/P1−, P2+/P2−, P3+/P1) of respective primary windings 302, 303, 304 of the transformer 301 may all be located on a same outer side of transformer 301, although variations of such positioning are possible. Likewise, the output port (P4+/P4−) of secondary winding 305 may be located on an inner side of the transformer 301. However, the output port could also be located on an outer side of the transformer 301 as well. It will be appreciated that the transformer 301 of FIG. 3 has been described for illustrative purposes only, and that other variations of the transformer 301 are available without departing from example embodiments of the invention.

Figure 4A:
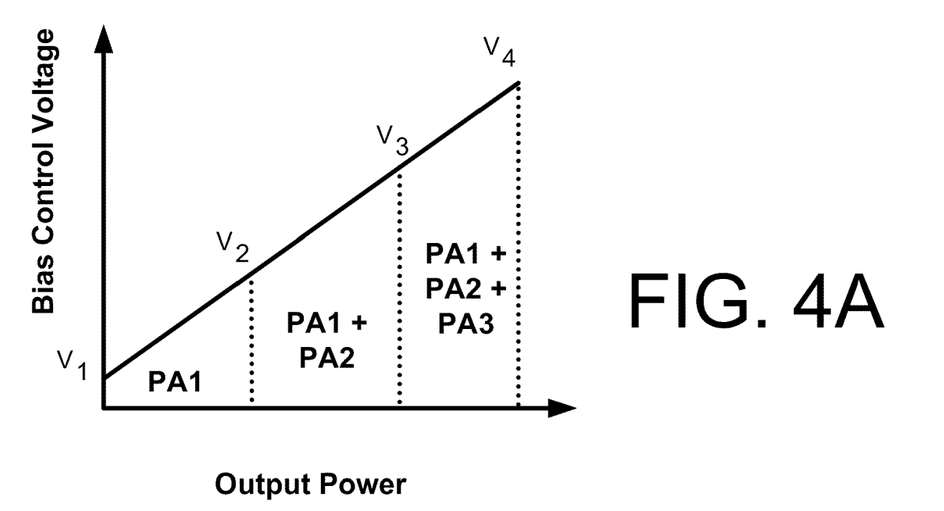
FIG. 4A illustrates a graph of continuous bias control voltage versus output power in accordance with an example embodiment of the invention.

FIG. 4A illustrates an output of the bias controller (e.g., bias controller 104) for continuous control, according to an example embodiment of the invention. The unit power amplifier 209 in FIG. 2 may be initially biased as class-AB close to class-B (which is known to use small bias current and have high efficiency but with low linearity). As the output power increases, the output of the bias controller likewise increases and the class of the power amplifier is shifted to class-AB close to class-A (which is known to use large bias current and have low efficiency but with high linearity). As an example, the bias controller voltage (for the activated unit power amplifiers) may range from (i) $V_1$ to $V_2$ for PA1 mode, (ii) $V_2$ to $V_3$ for PA1+PA2 mode, and (iii) $V_3$ to $V_4$ for PA1+PA2+PA3 mode. Thus, by using the bias adaptation and mode switching among three modes, PA1, PA1+PA2, and PA1+PA2+PA3, the current consumption can be acquired enhancing the efficiency at power back-off. In an example embodiment of the invention, V1 may be 0.5V, V2 may be 0.6V, V3 may be 0.7V, and V4 may be 0.8V, although other values may be utilized without departing from example embodiments of the invention.

Figure 4B:
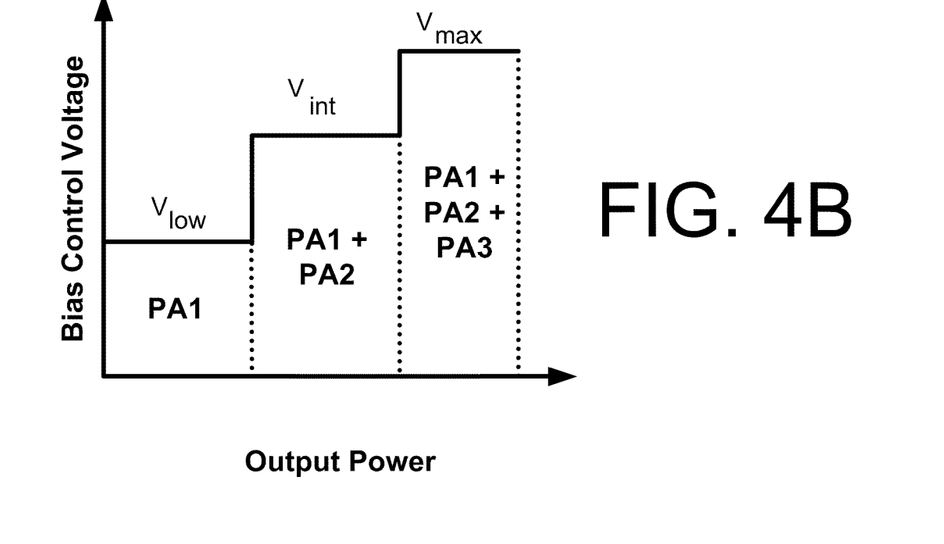
FIG. 4B illustrates a graph of discrete bias control voltage versus output power in accordance with an example embodiment of the invention.

FIG. 4B illustrates a graph of discrete bias control voltage versus output power in accordance with an example embodiment of the invention. As shown in FIG. 4B, the output of bias controller does not need to be continuous, but instead may be adjusted in discrete steps. Moreover, an optimum bias point for each mode may be decided in advance so that the output of the bias controller is selected in accordance with the desired output power for the mode of operation. Therefore, in an example embodiment of the invention, each mode may have a fixed bias control voltage from the bias controller. As an example, the bias controller voltage (for the activated unit power amplifiers) may be (i) $V_{low}$ for PA1 mode, (ii) $V_{int}$ for PA1+PA2 mode, and (iii) $V_{max}$ for PA1+PA2+PA3 mode. As an example, $V_{low}$ may be 0.5V, $V_{int}$ may be 0.6V, and $V_{max}$ may be 0.7V, according to an example embodiment of the invention.

Figure 5:
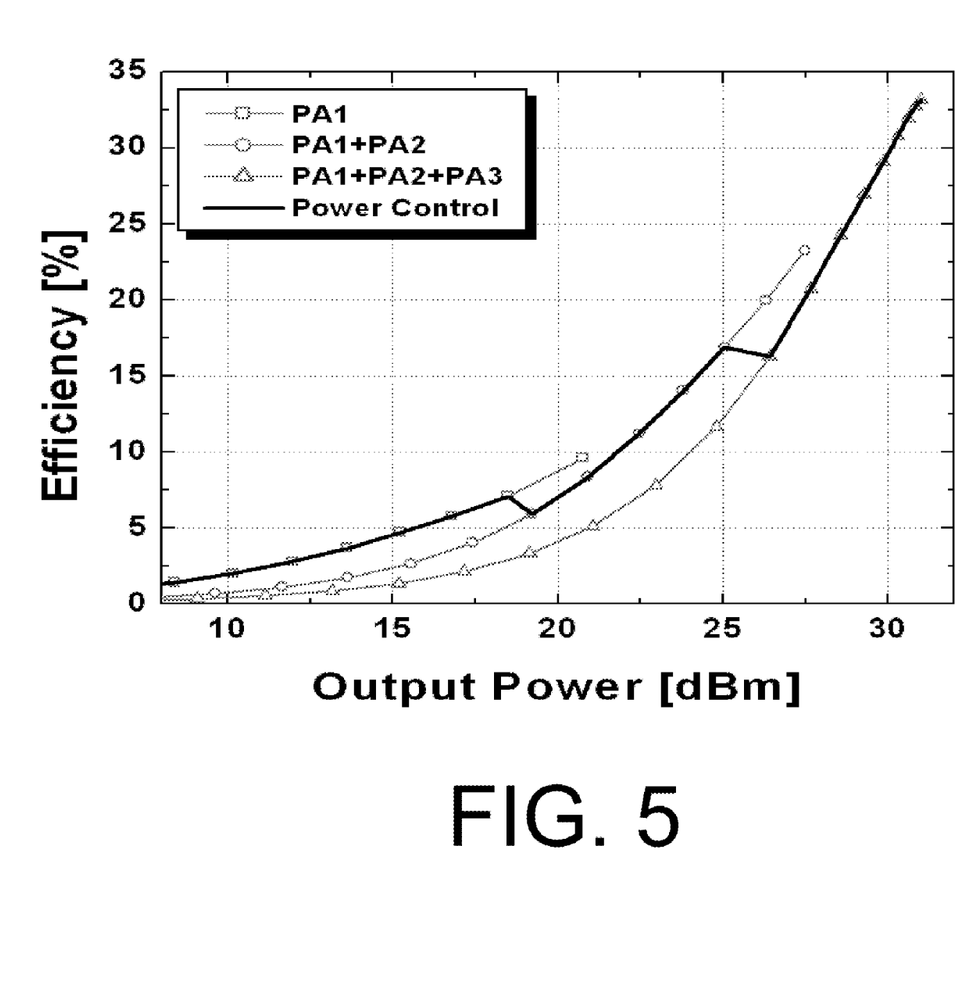
FIG. 5 illustrates example measured results for the discrete power control of an example power amplifier system utilizing example bias control and switch control in accordance with an example embodiment of the invention.

FIG. 5 illustrates measured results for the discrete power control of an example power amplifier system utilizing bias control and switch control in accordance with an example embodiment of the invention. The measured results of FIG. 5 are contained in a graph showing measured efficiency versus output power of the power amplifier system according to an example embodiment of the invention. As shown in the graph of FIG. 5, by using switch controller 105 and bias controller 104 at power back-off points, 25 dBm and 18 dBm, the efficiency is improved as can been seen by comparing the lighter lines to the darker line of the graph.

Figure 6:
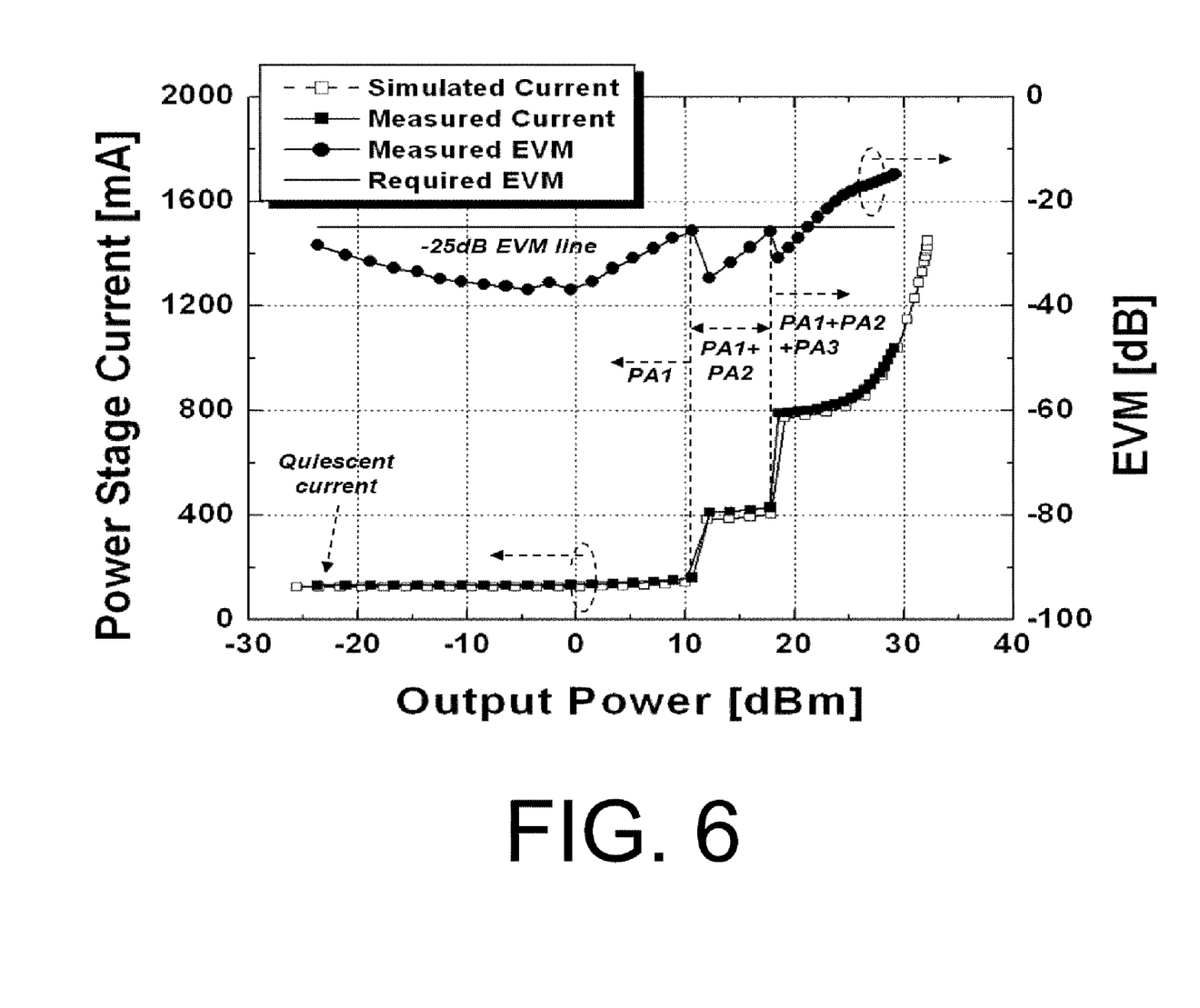
FIG. 6 illustrates example measured results for the discrete power control of an example power amplifier system utilizing example bias control and switch control in an application of IEEE 802.11g protocol in accordance with an example embodiment of the invention.
Figure 7:
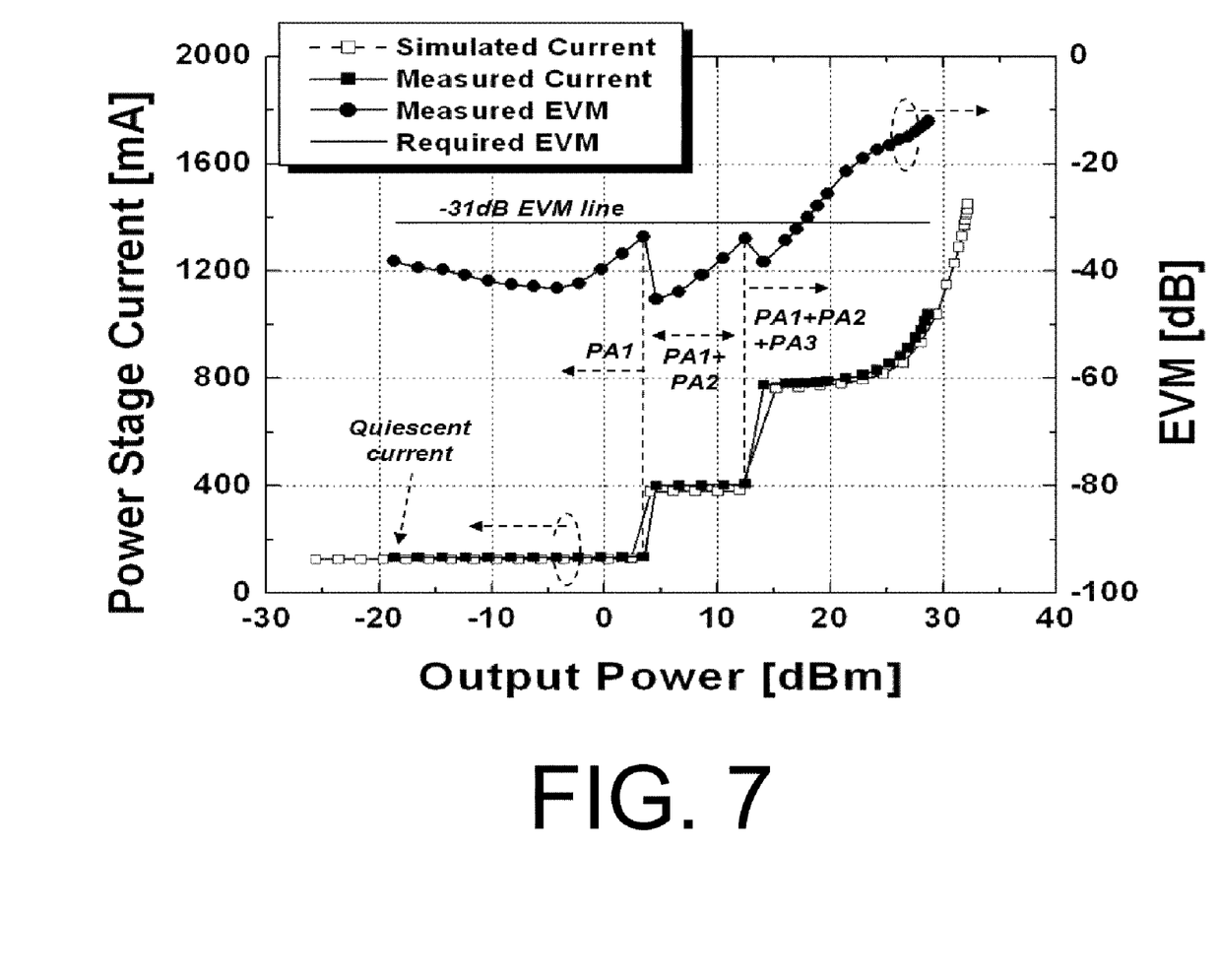
FIG. 7 illustrates example measured results for the discrete power control of an example power amplifier system utilizing example bias control and switch control in an application of IEEE 802.16e protocol in accordance with an example embodiment of the invention.

FIG. 6 illustrates measured results for the discrete power control of an example power amplifier system utilizing bias control and switch control in an application of IEEE 802.11g protocol in accordance with an example embodiment of the invention. FIG. 7 illustrates measured results for the discrete power control of an example power amplifier system utilizing bias control and switch control in an application of IEEE 802.16e protocol in accordance with an example embodiment of the invention. The linearity performance of power amplifiers depends on the requirement of the input modulation signals. To evaluate the performance for digital modulations, WLAN (wireless local area network) 802.11 g 54-Mbps 64-QAM (quadrature amplitude modulation) OFDM (orthogonal frequency division multiplexing) (EVM limit<−25 dB and WiMAX (worldwide interoperability for microwave access) 802.16e 54-Mbps 64-QAM OFDM (EVM limit<−31 dB) signals at 2.4 GHz are applied and discrete power control is executed according to the linearity specifications. The results are shown in FIGS. 6 and 7, respectively.

Initially, only one unit power amplifier is turned on to guarantee the minimum quiescent current of 130 mA and a minimum linearity requirement. Compared to the quiescent current 780 mA of the fully turned-on power amplifier, one unit power amplifier can save more than 650-mA current consumption in the low output power range. When the first turned-on power amplifier reaches to the point where the linearity requirement is violated with the input increase, the second unit power amplifier may be turned on by the switch controller. In this manner, it is possible to keep low quiescent current in the low power range while a linearity requirement is satisfied by supplying more current in the higher power range. In accordance with power control, the EVM tendency shows the saw-like shape but not exceeding the limit of the requirement. According to an example embodiment of the invention embodiment of the invention, the maximum linear output power is 22 dBm for the WLAN and 18 dBm for the WiMAX signals, respectively, as shown in the FIGS. 6 and 7.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A power amplifier system, comprising:
   a plurality of unit power amplifiers, wherein each unit power amplifier includes at least one respective output port, at least one respective bias control port, and at least one respective switch control port;
   a plurality of primary windings, wherein each primary winding is connected to the at least one respective output port of a respective one of the plurality of unit power amplifiers;
   a secondary winding inductively coupled to the plurality of primary windings, wherein the secondary winding provides an overall output;
   a bias controller, wherein the bias controller provides, based at least in part on a level of output power, a respective bias voltage to one or more of the plurality of unit power amplifiers via the at least one respective bias control port; and
   a switch controller, wherein the switch controller operates to activate or deactivate at least one of the plurality of unit power amplifiers via a respective control signal to the respective switch control port.

2. The power amplifier system of claim 1, wherein the plurality of unit power amplifiers operate in accordance with the respective bias voltage from the bias controller.

3. The power amplifier system of claim 1, wherein the operation of the respective unit power amplifier in accordance with the respective bias voltage is characterized by an efficiency of the respective unit power amplifier.

4. The power amplifier system of claim 1, wherein the secondary winding provides an overall output having an associated output power level, wherein one or both of the respective bias voltage or the respective control signal are responsive at least in part to the output power level.

5. The power amplifier system of claim 4, wherein the output power level is within one of a plurality of output power ranges, including at least a first power output range and a second power output range lower than the first power output range, the first power output range defining a first operational mode, and the second power output range defining a second operational mode,
   wherein for the first operational mode, the switch controller activates a first number of the plurality of unit power amplifiers, and
   wherein for the second operational mode, the switch controller activates a second number of the plurality of power amplifiers, the second number less than the first number.

6. The power amplifier system of claim 5,
   wherein for the first operational mode, the respective bias voltage for the respective activated ones of the plurality of unit power amplifiers is a first constant voltage, and
   wherein for the second operational mode, the respective bias voltage for the respective activated ones of the plurality of unit power amplifiers is a second constant voltage.

7. The power amplifier system of claim 5,
   wherein for the first operational mode, the respective bias voltage for the respective activated ones of the plurality of unit power amplifiers varies within a first bias voltage range according to the output power level, wherein for the second operational mode, the respective bias voltage for the respective activated ones of the plurality of unit power amplifiers varies within a second bias voltage range according to the output power level.

8. The power amplifier system of claim 5,
wherein the plurality of output power ranges further includes a third power output range less than the second power output range, the third power output range defining a third operational model,
wherein for the third operational mode, the switch controller activates a third number of the plurality of unit power amplifiers, the third number less than the second number.

9. The power amplifier system of claim 1, wherein each unit power amplifier comprises a respective gain stage and a respective switch stage, wherein the respective gain stage provides the at least respective bias control port, and wherein the respective switch stage provides the at least one respective switch control port.

10. The power amplifier system of claim 9, wherein if the switch controller deactivates a respective unit power amplifier of the plurality of unit power amplifiers, then a respective output of the respective gain stage is isolated from the at least one respective output port of the respective unit power amplifier.

11. The power amplifier system of claim 9, wherein the respective gain stage includes a respective first transistor having a first gate or base, a first source or emitter, and a first drain or collector, wherein the respective switch stage includes a respective second transistor having a second gate or base, a second source or emitter, and a second drain or collector, wherein the first gate or base is associated with the at least one respective bias control port, wherein the first source or emitter is connected to ground, wherein the first drain or collector is connected to the second source or emitter, wherein the second gate or base is associated with the at least one respective switch control port, and the second drain or collector is associated with the at least one respective output port.

12. The power amplifier system of claim 11, wherein the first gate or base is connected to the bias controller via a first bias resistor, wherein the second gate or base is connected to the switch controller via a second bias resistor.

13. The power amplifier system of claim 11, wherein the second drain or collector is connected to a DC voltage supply.

14. The power amplifier system of claim 1, wherein each of the primary windings includes a single turn, and wherein the single secondary winding includes more than one turn.

15. A power amplifier system, comprising:
a plurality of unit power amplifiers, wherein each unit power amplifier includes a respective input port, a respective output port, a respective bias control port, and a respective switch control port;
a transformer comprising a plurality of primary windings that is inductively coupled to a single secondary winding, wherein each primary winding is connected to a respective output port of the respective plurality of unit power amplifiers; and
one or more controllers for biasing and activating ones of the plurality of unit power amplifiers, wherein respective outputs from one or more activated ones of the plurality of unit power amplifiers are provided to the respective primary windings, which induce voltage on the secondary winding to provide an overall output.

16. The power amplifier system of claim 15, wherein the biasing and activating of the ones of the plurality of unit power amplifiers are responsive at least in part on an output power level associated with the overall output.

17. The power amplifier system of claim 16, wherein the output power level is within one of a plurality of output power ranges, including at least a first power output range and a second power output range lower than the first power output range, the first power output range defining a first operational mode, and the second power output range defining a second operational mode,
wherein for the first operational mode, a first number of the plurality of unit power amplifiers are activated by the one or more controllers, and
wherein for the second operational mode, a second number of the plurality of power amplifiers are activated by the one or more controllers, the second number less than the first number.

18. The power amplifier system of claim 17,
wherein for the first operational mode, the biasing for the respective activated ones of the plurality of unit power amplifiers is at a first constant voltage, and
wherein for the second operational mode, the biasing for the respective activated ones of the plurality of unit power amplifiers is at a second constant voltage.

19. The power amplifier system of claim 17,
wherein for the first operational mode, the biasing for the respective activated ones of the plurality of unit power amplifiers varies within a first bias voltage range according to the output power level,
wherein for the second operational mode, the respective bias voltage for the respective activated ones of the plurality of unit power amplifiers varies within a second bias voltage range according to the output power level.

20. The power amplifier system of claim 17, wherein each unit power amplifier comprises a respective gain stage and a respective switch stage, wherein the respective gain stage provides the respective bias control port, and wherein the respective switch stage provides the respective switch control port, wherein the respective gain stage includes a respective first transistor having a first gate or base, a first source or emitter, and a first drain or collector, wherein the respective switch stage includes a respective second transistor having a second gate or base, a second source or emitter, and a second drain or collector, wherein the first gate or base is associated with the at least one respective bias control port, wherein the first source or emitter is connected to ground, wherein the first drain or collector is connected to the second source or emitter, wherein the second gate or base is associated with the at least one respective switch control port, and the second drain or collector is associated with the at least one respective output port.

* * * * *